(12) United States Patent
Chang et al.

(10) Patent No.: US 11,424,185 B2
(45) Date of Patent: Aug. 23, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Cheng-Wei Chang, Taipei (TW); Chia-Hung Chu, Taipei (TW); Kao-Feng Lin, Hsinchu (TW); Hsu-Kai Chang, Hsinchu (TW); Shuen-Shin Liang, Hsinchu County (TW); Sung-Li Wang, Zhubei (TW); Yi-Ying Liu, Hsinchu (TW); Po-Nan Yeh, Hsinchu (TW); Yu Shih Wang, Tainan (TW); U-Ting Chiu, Hsinchu (TW); Chun-Neng Lin, Hsinchu (TW); Ming-Hsi Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/945,595

(22) Filed: Jul. 31, 2020

(65) Prior Publication Data
US 2021/0202399 A1 Jul. 1, 2021

Related U.S. Application Data

(60) Provisional application No. 62/955,123, filed on Dec. 30, 2019.

(51) Int. Cl.
*H01L 23/532* (2006.01)
*H01L 23/522* (2006.01)
(Continued)

(52) U.S. Cl.
CPC .. *H01L 23/53257* (2013.01); *H01L 21/76802* (2013.01); *H01L 21/76805* (2013.01);
(Continued)

(58) Field of Classification Search
CPC ......... H01L 21/76805; H01L 21/76877; H01L 21/02063; H01L 21/02071;
(Continued)

(56) References Cited

U.S. PATENT DOCUMENTS

| 7,192,871 B2 | 3/2007 | Maekawa et al. |
| 10,163,704 B2 | 12/2018 | Chen et al. |

(Continued)

FOREIGN PATENT DOCUMENTS

| JP | 2005-005669 A | 1/2005 |
| JP | 2006-024905 A | 1/2006 |

(Continued)

*Primary Examiner* — Shahed Ahmed
*Assistant Examiner* — Vicki B. Booker
(74) *Attorney, Agent, or Firm* — McDermott Will & Emery LLP

(57) ABSTRACT

A semiconductor device includes a gate electrode, a source/drain structure, a lower contact contacting either of the gate electrode or the source/drain structure, and an upper contact disposed in an opening formed in an interlayer dielectric (ILD) layer and in direct contact with the lower contact. The upper contact is in direct contact with the ILD layer without an interposing conductive barrier layer, and the upper contact includes ruthenium.

20 Claims, 12 Drawing Sheets

(51) Int. Cl.
*H01L 21/768* (2006.01)
*H01L 21/285* (2006.01)
*H01L 21/02* (2006.01)

(52) U.S. Cl.
CPC .... *H01L 21/76877* (2013.01); *H01L 23/5226* (2013.01); *H01L 21/02063* (2013.01); *H01L 21/02071* (2013.01); *H01L 21/28568* (2013.01); *H01L 23/53295* (2013.01)

(58) Field of Classification Search
CPC ......... H01L 21/28568; H01L 23/53257; H01L 21/76802; H01L 23/5226; H01L 23/53295; H01L 23/53242; H01L 21/76814; H01L 21/823431; H01L 21/823475; H01L 21/823821; H01L 21/823871; H01L 27/0886; H01L 27/0924; H01L 21/32134; H01L 21/823418

See application file for complete search history.

(56) References Cited

U.S. PATENT DOCUMENTS

| | | |
|---|---|---|
| 2001/0019857 A1 | 9/2001 | Yokoyama et al. |
| 2004/0140494 A1* | 7/2004 | Fishburn ........... H01L 21/76802 257/296 |
| 2004/0245650 A1 | 12/2004 | Lee |
| 2004/0253811 A1 | 12/2004 | Lee et al. |
| 2010/0176511 A1* | 7/2010 | Maekawa ......... H01L 21/76814 257/751 |
| 2010/0264543 A1* | 10/2010 | Ponoth ............. H01L 21/76847 257/751 |
| 2011/0198756 A1 | 8/2011 | Thenappan et al. |
| 2016/0163587 A1 | 6/2016 | Backes et al. |
| 2018/0261543 A1 | 9/2018 | Clevenger et al. |
| 2019/0259855 A1 | 8/2019 | Cheng et al. |

FOREIGN PATENT DOCUMENTS

| | | |
|---|---|---|
| KR | 10-2017-0078514 A | 7/2017 |
| TW | 200524070 A | 7/2005 |

* cited by examiner

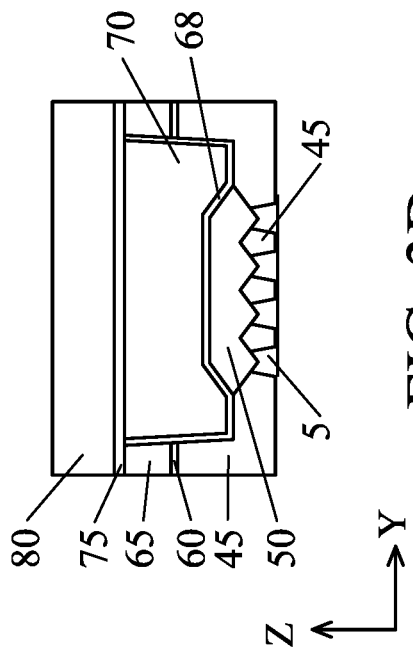
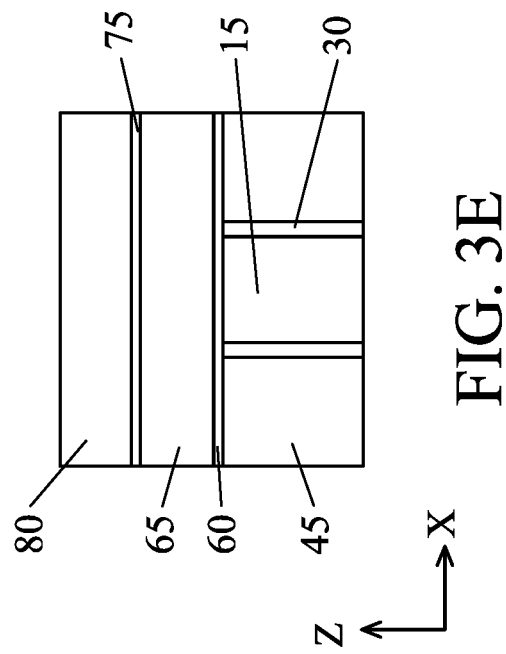
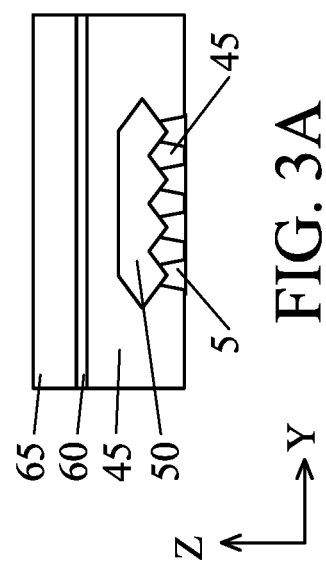
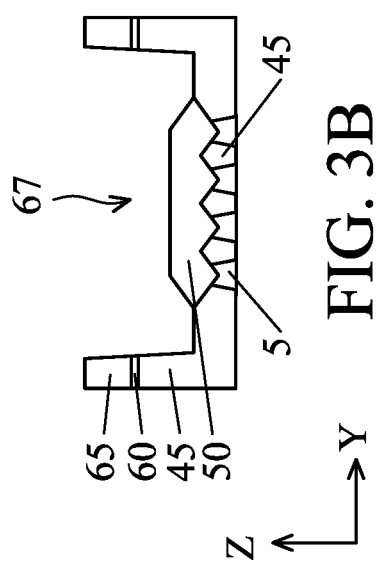
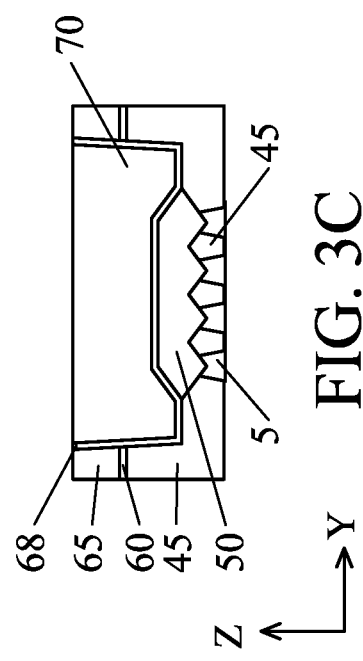

SEMICONDUCTOR DEVICE AND MANUFACTURING METHOD THEREOF

RELATED APPLICATIONS

This application claims priority to U.S. Provisional Patent Application No. 62/955,123 filed on Dec. 30, 2019, the entire contents of which is incorporated herein by reference.

BACKGROUND

With a decrease of dimensions of semiconductor devices, a self-aligned contact (SAC) has been widely utilized for fabricating, e.g., source/drain contacts arranged closer to gate structures in a field effect transistor (FET). It is generally required that the source/drain contacts have lower resistivity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D and 3E show cross sectional views of various stages of the sequential fabrication process of a semiconductor device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations explained with respect to the one embodiment can be employed in other embodiments, and detailed explanation thereof may be omitted.

Figure 1A:
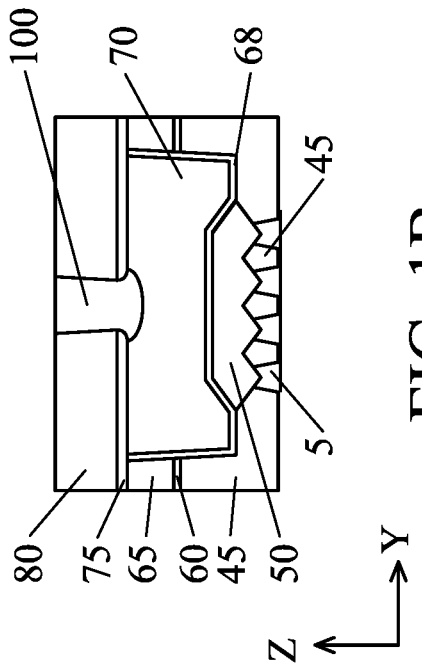
FIGS. 1A, 1B, 1C and 1D show various views of a semiconductor device according to an embodiment of the present disclosure.
Figure 1C:
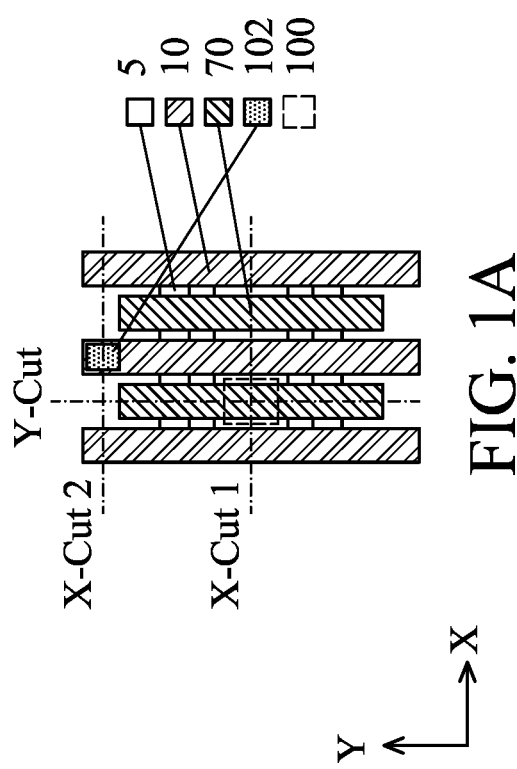
Figure 1B:
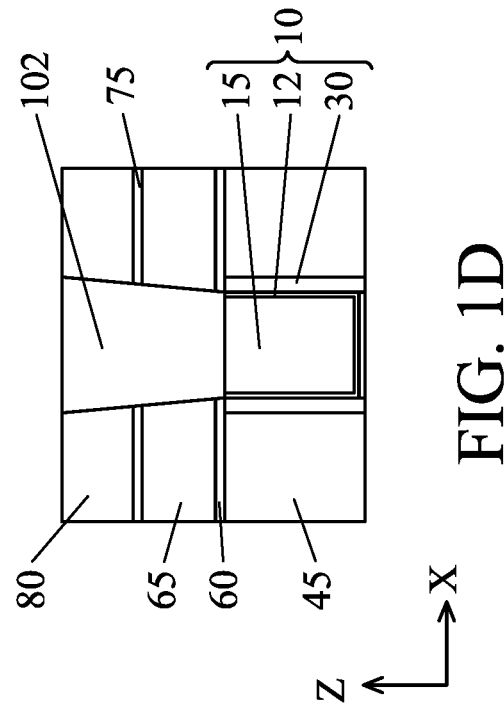
Figure 1D:
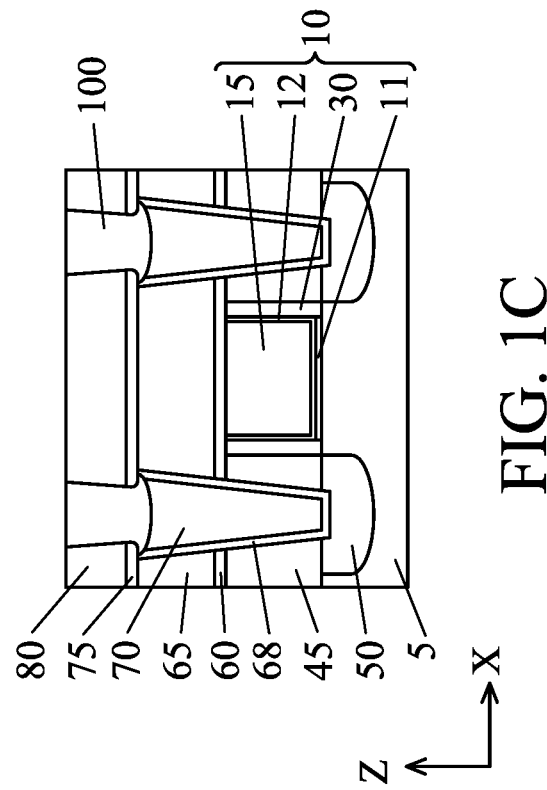

FIGS. 1A, 1B, 1C and 1D show various views of a semiconductor device according to an embodiment of the present disclosure. FIG. 1A is a plan view, FIG. 1B is a cross sectional view (Y-cut), FIG. 1C is a cross sectional view (X-cut 1) and FIG. 1D is a cross sectional view (X-cut 2). In some embodiments, the semiconductor device shown in FIGS. 1A-1D is a fin field effect transistor (Fin FET).

In FIG. 1A, three gate structures 10 extending in the Y direction are disposed over four fin structures 5 extending in the X direction. Portions between the gate structures 10 are source/drain regions 50 (see, FIGS. 1B and 1C), and source/drain contacts 70 are disposed over the source/drain regions 50. In some embodiments, the source/drain regions 50 include one or more epitaxially-formed semiconductor layers (epitaxial layers). In some embodiments, the source/ drain contact 70 are contact bars extending in the Y direction beyond the source/drain regions 50. Thus, a width of the source/drain epitaxial layer (source/drain region) 50 is smaller than a width of the source/drain contact 70 in the Y direction. As shown in FIGS. 1A and 1B, a width of the source/drain contact 70 is greater than a width of the upper contact 100 in the Y direction, in some embodiments. In some embodiments, one or more gate contacts 102 are disposed on one or more gate electrodes of the gate structures 10. Further, in some embodiments, upper contacts 100 are disposed over the source/drain contacts 70.

As shown in FIGS. 1B-1D, the source/drain regions 50 are formed in a recesses formed in the fin structure 5. The gate structure 10 includes an interfacial layer 11 made of a chemically formed silicon oxide, a gate dielectric layer 12 formed over the fin structure 5, a metal gate electrode 15 and gate sidewall spacers 30. The gate structure 10 is embedded in a first interlayer dielectric (ILD) layer 45. The first ILD layer 45 includes one or more dielectric layers. In some embodiments, a first etch stop layer 60 is disposed over the first ILD layer 45, and a second ILD layer 65 is formed over the first etch stop layer 60. Further, a second etch stop layer 75 is disposed over the second ILD layer 65 and a third ILD layer 80 is formed over the second etch stop layer 75.

The first to third ILD layers 45, 65, 80 include one or more layers of insulating material, for example, a silicon oxide based material, such as silicon dioxide ($SiO_2$), SiOC and SiOCN. In some embodiments, a low-k material or an organic material is used for the ILD layers. The first and second etch stop layers 60, 75 are made of different material than the ILD layers and include one or more layers of insulating material, for example, silicon nitride based material, such as silicon nitride and SiON.

In some embodiments, the third ILD layer 80 contains no Group IV elements other than Si and C. In other embodiments, the third ILD layer 80 includes Ge and/or Sn to introduce compressive stress in the third ILD layer 80. In some embodiments, a concentration of Ge and/or Sn is in a range from about 0.01 atomic % to 1 atomic %.

The source/drain contact 70 is formed in a contact opening (hole) passing through the first and second ILD layers 45, 65 and the first and second etch stop layers 60, 75. In some embodiments, a first contact liner layer 68 is formed on the inner surface of the contact opening. In some embodiments, the first contact liner layer 68 includes one or more conductive material layers, such as Ti, TiN, Ta and TaN. In certain embodiments, a TiN layer is used as the first contact line layer 68.

The source/drain contact 70 includes one or more conductive material layers, such as W, Co, Ni, Mo and an alloy thereof. In certain embodiments, the source/drain contact 70 is made of Co.

The upper contact 100 is formed in a contact opening (hole) passing through the third ILD layer 80 and the second etch stop layer 75, and the upper contact 102 (gate contact) is formed in a contact opening (hole) passing through the third ILD layer 80, the second etch stop layer 75, the second ILD layer 65 and the first etch stop layer 60. The upper contacts 100, 102 include ruthenium (Ru) or a Ru alloy.

In some embodiments, a purity of ruthenium in the upper contact 100, 102 is equal to or more than about 99.9% and less than 100%. In some embodiments, the upper contact 100, 102 includes an impurity other than ruthenium. In some embodiments, an amount of impurity is in a range from 0.00001 atomic % to 0.1 atomic %. In some embodiments, the impurity includes one or more selected from the group consisting of alkaline metals and alkaline earth metals. In certain embodiments, the impurity is one or more of Ca, K and Na. In other embodiments, the impurity includes carbon.

As shown in FIGS. 1B and 1C, the upper contact 100 is in direct contact with the third ILD layer 80 without interposing any conductive barrier layer, such as a Ti, TiN, Ta and/or TaN layer in some embodiments. In some embodiments, the upper contact 100 is in direct contact with the second etch stop layer 75 without interposing any conductive barrier layer. Similarly, the upper contact 102 is in direct contact with the third ILD layer 80, the second etch stop layer 75, the second ILD layer 65 and the first etch stop layer 60 without interposing any conductive barrier layer as shown in FIG. 1D, in some embodiments.

Further, as shown in FIGS. 1B and 1C, a part of the upper contact 100 penetrates into the source/drain contact 70 in some embodiments. Further, in some embodiments, the part of the upper contact 100 is disposed below the second etch stop layer 75 and is in contact with a bottom surface of the second etch stop layer 75. In some embodiments, the part of the upper contact 100 penetrating into the source/drain contact 70 is in contact with the first contact liner layer 68 as shown in FIG. 1C. As shown in FIGS. 1B and 1C, the upper contact 100 has a rivet shape with a convex round head in some embodiments. In other embodiments, the head of the rivet shape is a triangular or a trapezoid with or without rounded corners.

In some embodiments, a bottom corner of the second etch stop layer 75 has a rounded corner. In some embodiments, an upper corner of the second etch stop layer 75 has a rounded corner of which a radius of curvature (more than 0 nm) is smaller than a radius of curvature of the bottom corner. In other embodiments, the upper corner of the second etch stop layer 75 is not rounded.

FIGS. 2A-2E show various stages of a sequential fabrication process of a semiconductor device corresponding to the structure shown in FIGS. 1A-1D according to an embodiment of the present disclosure. It is understood that additional operations can be provided before, during, and after processes shown by FIGS. 2A-2E, and some of the operations described below can be replaced or eliminated, for additional embodiments of the method. The order of the operations/processes may be interchangeable.

Figure 2A:
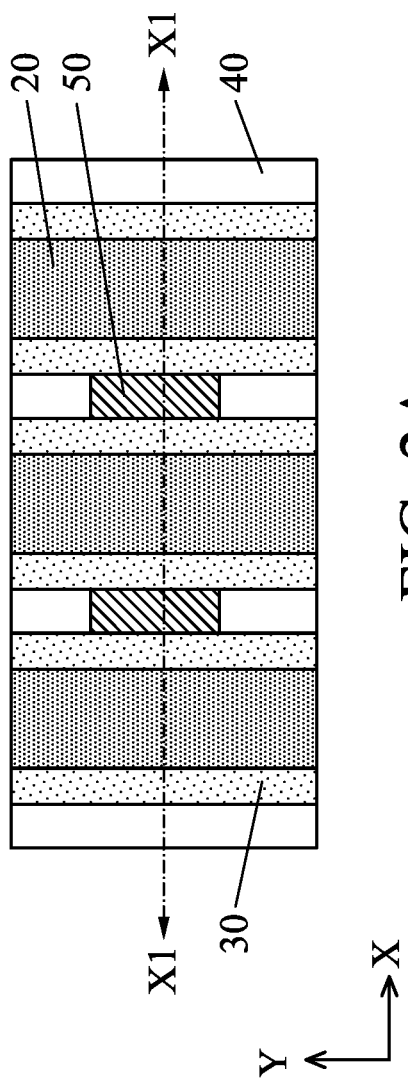
FIG. 2A shows a plan view (viewed from the above) illustrating one of the various stages of a sequential fabrication process of a semiconductor device according to one embodiment of the present disclosure.
Figure 2B:
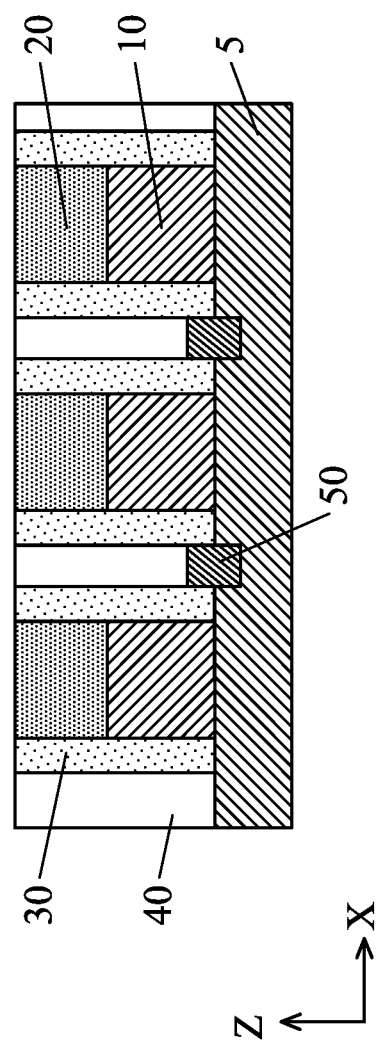
FIG. 2B shows a cross sectional view along line X1-X1 of FIG. 2A.

FIGS. 2A and 2B show one of the stages of a sequential fabrication process of a semiconductor device according to one embodiment of the present disclosure. FIG. 2A shows a plan (top) view and FIG. 2B shows a cross sectional view along line X1-X1 of FIG. 2A.

FIGS. 2A and 2B show a structure of a semiconductor device after metal gate structures 10 are formed. The metal gate structure 10 includes a metal gate electrode 15 and a gate dielectric layer 12. In FIGS. 2A and 2B, metal gate structures 10 are formed over a channel region of the fin structure 5, for example, a part of a fin structure, and cap insulating layers 20 are disposed over the metal gate structures 10. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 8 nm in other embodiments. The combination of the metal gate structure 10, the cap insulating layer 20 and sidewall spacers 30 may be collectively referred to as a gate structure. Further, source/drain regions 50 are formed adjacent to the gate structures, and spaces between the gate structures are filled with an interlayer dielectric (ILD) layer 40.

Figure 2C:
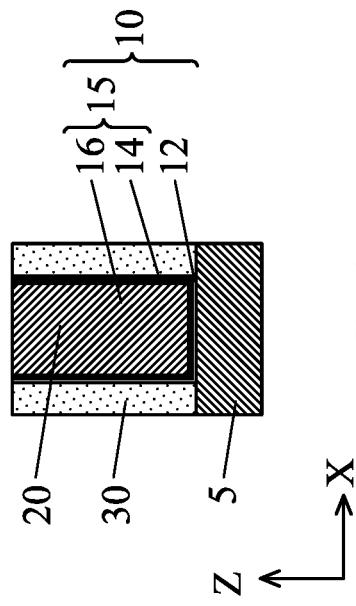
FIGS. 2C and 2D are enlarged views of the gate structure.

FIG. 2C is an enlarged view of the gate structure. The metal gate electrode 15 includes one or more layers 16 of metal material, such as Al, Cu, W, Ti, Ta, TiN, TiAl, TiAlC, TiAlN, TaN, NiSi, CoSi, or other conductive materials. A gate dielectric layer 12 disposed between the channel region of the fin structure 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The gate sidewall spacer 30 is made of a different material than the cap insulating layer 20 and includes one or more layers of insulating material such as a silicon nitride based material, including SiN, SiON, SiCN and SiOCN. The ILD layer 40 includes one or more layers of an insulating material, such as, a silicon oxide based material including silicon dioxide ($SiO_2$) and SiON.

Figure 2D:
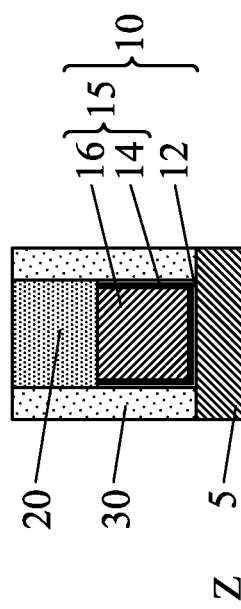

In some embodiments, no gate cap insulating layer is formed, as shown in FIG. 2D.

The material of the sidewall spacer 30, the material of the cap insulating layer 20, and a material of the ILD layer 40 are different from each other, so that each of these layers can be selectively etched. In one embodiment, the gate sidewall spacer 30 is made of SiOCN, SiCN or SiON, the cap insulating layer 20 is made of SiN, and the ILD 40 layer is made of $SiO_2$.

In this embodiment, fin field effect transistors (Fin FETs) fabricated by a gate-replacement process are employed.

Figure 2E:
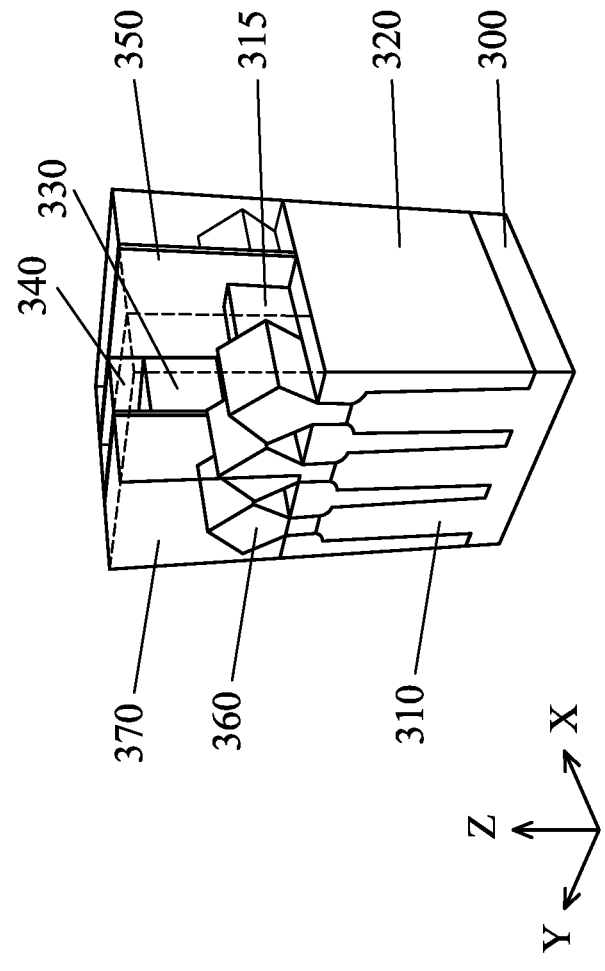
FIG. 2E shows a perspective view illustrating one of the various stages of a sequential fabrication process of a semiconductor device according to one embodiment of the present disclosure.

FIG. 2E shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors, such as SiC and SiGe; Group III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Gate sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric (ILD) layer 370 is formed over the dummy gate structure and the source/drain region. After a planarization operation, the dummy gate structure is removed to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, to obtain the Fin FET structure shown in FIG. 2E. In FIG. 2E, parts of the metal gate structure 330, the cap isolation layer 340, the gate sidewall spacers 350 and the ILD layer 370 are cut to show the underlying structure.

The fin structure 310, the metal gate structure 330, the cap isolation layer 340, the gate sidewall spacers 350, the source/drain 360 and the ILD layer 370 of FIG. 2E substantially correspond to the fin structure 5, the metal gate structures 10, the cap insulating layers 20, the gate sidewall spacers 30, the source/drain regions 50 and the interlayer dielectric (ILD) layer 40, of FIGS. 1A-1D, respectively. In some embodiments, one or more ILD layer is additionally formed over the ILD layer 40, thereby forming a first ILD layer 45.

FIGS. 3A-3E to 9A-9B show various stages of a sequential fabrication process of a semiconductor device corresponding to the structure shown in FIGS. 1A-1D according to an embodiment of the present disclosure. It is understood that additional operations can be provided before, during, and after processes shown by FIGS. 3A-9B, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted. In FIGS. 3A-9B, four fin structures 5 are shown, but the number of the fin structures 5 is not limited to four, and can be one, two, three or five or more.

After the metal gate structure is formed, a first insulating layer as the first etch stop layer 60 is formed over the first ILD layer 45 (or 40), and a second insulating layer as the second ILD layer 65 is formed over the first etch stop layer 60, as shown in FIG. 3A. The etch stop layer 60 and the second ILD layer 65 are formed by suitable film formation methods, such as CVD, physical vapor deposition (PVD) or atomic layer deposition (ALD).

By using one or more lithography and etching operations, a first contact hole (opening) 67 for the lower contact (source/drain contact) 70 is formed in the first and second ILD layers 45, 65, as shown in FIG. 3B.

Then, the first contact liner layer 68 is conformally formed in the first contact hole 67 and on the upper surface of the second ILD layer 65, and a conductive material is formed over the first contact liner layer 68. The contact liner layer 68 and the conductive material layer are formed by suitable film formation methods, such as CVD, PVD, ALD or plating. Subsequently, a planarization operation, such as an etch back operation or a chemical mechanical polishing (CMP) operation, is performed to form the source/drain contact 70, as shown in FIG. 3C.

Subsequently, a third insulating layer as the second etch stop layer 75 and a fourth insulating layer as the third ILD layer 80 are formed, as shown in FIGS. 3D and 3E. FIG. 3D shows a cross sectional view along the Y direction cutting the source/drain contact 70 and FIG. 3E shows a cross sectional view along the X direction cutting the gate electrode 15. In FIGS. 3A-9B, the gate dielectric layer 12 is omitted for simplicity.

Figure 4B:
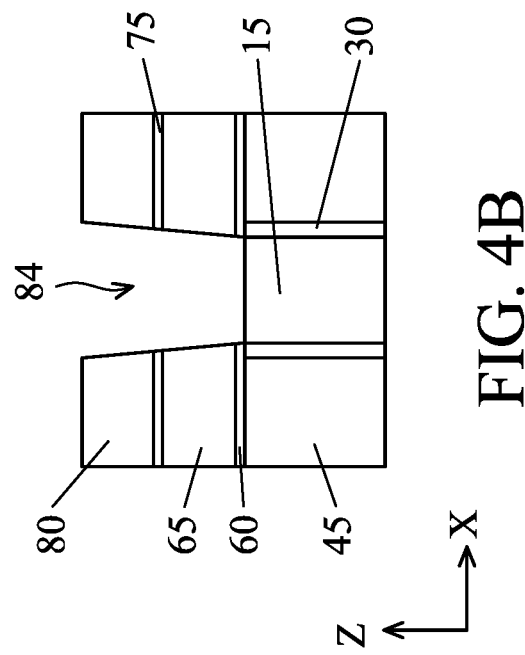
FIGS. 4A and 4B show cross sectional views of various stages of the sequential fabrication process of a semiconductor device according to an embodiment of the present disclosure.
Figure 4A:
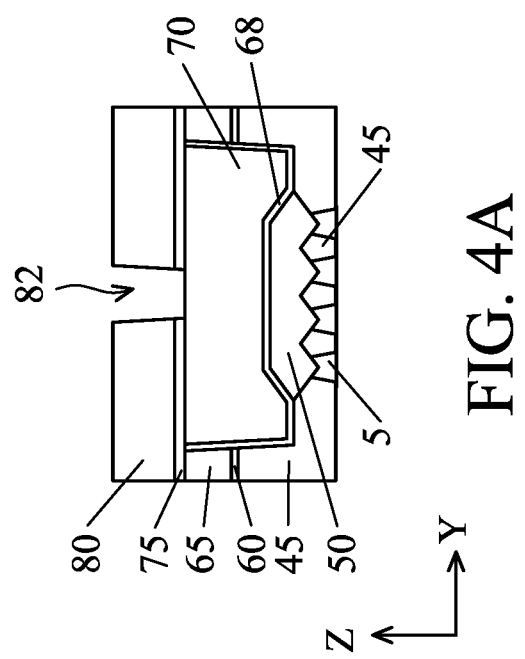

As shown in FIGS. 4A and 4B, by using one or more lithography and etching operations, a second contact hole (opening) 82 for the upper contact 100 is formed in the third ILD layer 80 and the second etch stop layer 75, and a third contact hole (opening) 84 for the upper contact (gate contact) 102 is formed in the third ILD layer 80, the second etch stop layer 75 and the second ILD layer 65. In some embodiments, the thickness of the second etch stop layer 75 is in a range from about 5 nm to about 20 nm and is in a range from about 10 nm to about 15 nm in other embodiments. In some embodiments, at least a part of the upper surface of the metal gate electrode 15 is exposed at the bottom of the third contact hole 84 by this etching as shown in FIG. 4B. In some embodiments, the contact holes 82 and 84 are formed at the same etching operation using the same mask pattern, and in other embodiments, the contact holes 82 and 84 are formed by different etching operations using different mask patterns.

Figure 5B:
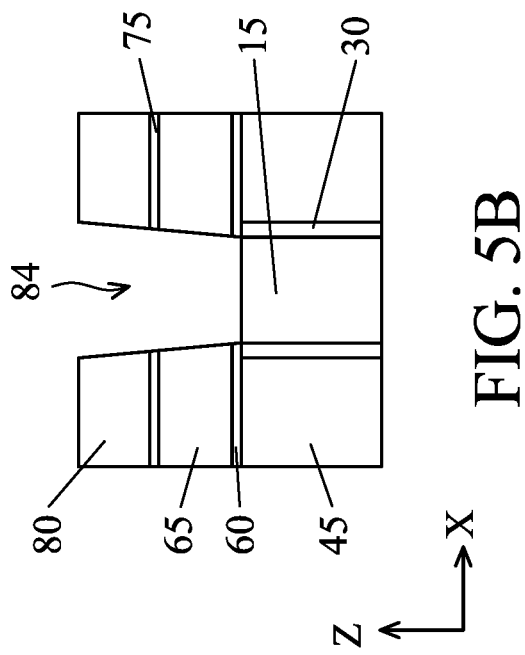
FIGS. 5A, 5B and 5C show cross sectional views of various stages of the sequential fabrication process of a semiconductor device according to an embodiment of the present disclosure.
Figure 5A:
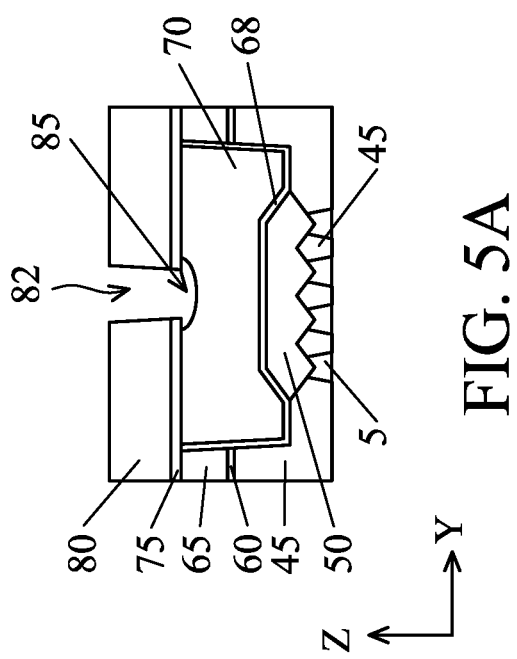

In some embodiments, as shown in FIG. 5A, the exposed portion of the source/drain contact 70 is partially etched (recessed) to form a recess 85. In some embodiments, the exposed upper portion of the source/drain contacts 70 is vertically and laterally (horizontally) etched to form the recess 85.

The etching is one or more of isotropic etching operations in some embodiments. In some embodiments, the etching is wet etching using an acid. In some embodiments, the acid is an organic acid. In certain embodiments, when the source/drain contact layer 70 is made of Co, the organic acid is a 4-methyl-2-(phenylamino)-1,3-thiazole-5-carboxylic acid. In some embodiments, after the acid etching, a wet cleaning operation using isopropyl alcohol is performed. In other embodiments, the etching is a chemical dry etching using a gas containing, for example, HCl. In some embodiments, the wet etchant includes benzotriazole.

Figure 5C:
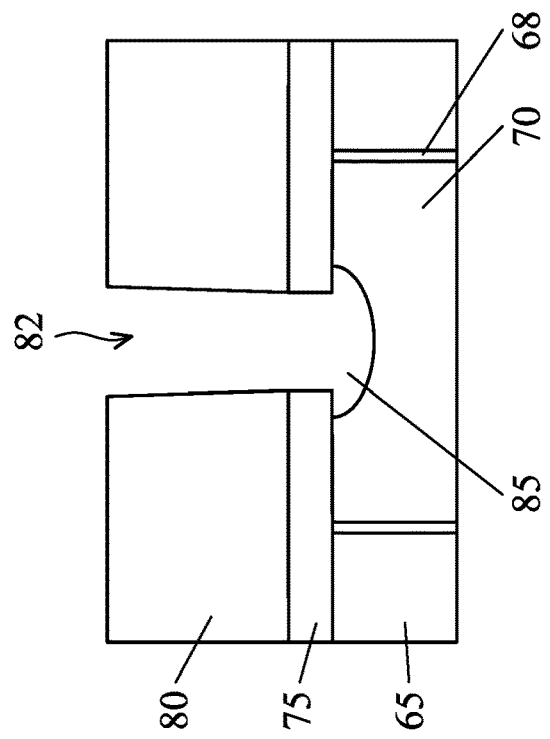

In some embodiments, the bottom of recess 85 has an arc shape as shown in FIGS. 5A and 5C. FIG. 5C is an enlarged view of FIG. 5A. In other embodiments, the recess has a triangular or a trapezoidal shape. As shown in FIG. 5C, the recess 85 horizontally penetrates under the second etch stop layer 75.

In some embodiments, during the recess etching at the second contact hole 82, the upper surface of the metal gate electrode 15 exposed at the bottom of the third contact hole 84 is covered by the first etch stop layer 60 and thus is not etched. In other embodiments, as shown in FIG. 5B, even if the first etch stop layer does not cover the upper surface of the metal gate electrode 15 exposed at the bottom of the third contact hole 84, the metal gate electrode 15 is not substantially etched due to the selectivity of the etching. In other words, the etchant of the etching selectively etches the material (e.g., Co) of the source/drain contact 70 against the material (e.g., W) of the gate electrode 10.

Figure 6:
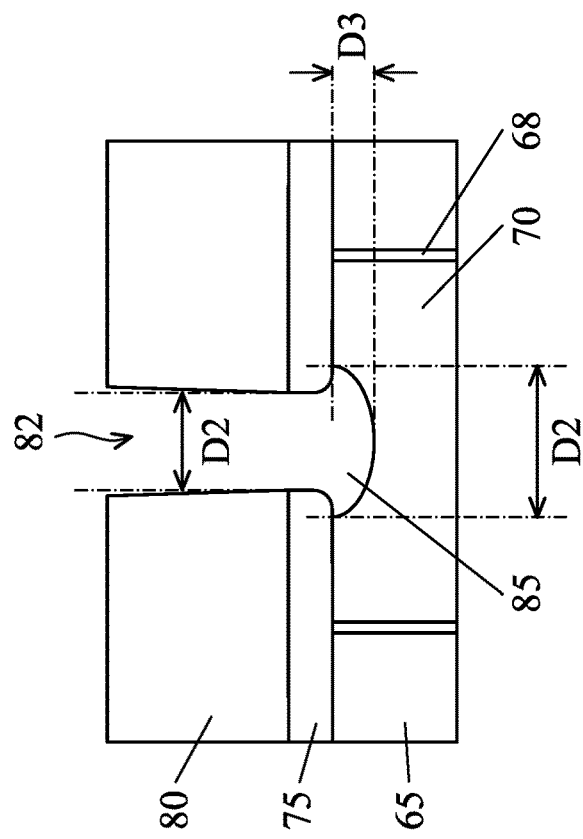
FIG. 6 shows a cross sectional view of various stages of the sequential fabrication process of a semiconductor device according to an embodiment of the present disclosure.

Next, a pre-deposition cleaning operation is performed at the second contact hole 82 and the recessed source/drain contact 70 as shown in FIG. 6.

In some embodiments, the pre-deposition cleaning operation includes a plasma treatment. In some embodiments, the plasma treatment includes hydrogen plasma and/or argon plasma. In certain embodiments, the plasma treatment includes a hydrogen plasma treatment followed by an argon plasma treatment. In some embodiments, a time duration of the hydrogen plasma treatment is longer than a time duration of the argon plasma treatment. In some embodiments, the time duration of the hydrogen plasma treatment is in a range from about 60 sec to about 300 sec, and is in a range from about 90 sec to about 250 sec in other embodiments, depending on design and/or process requirements/conditions. In some embodiments, the time duration of the argon plasma treatment is in a range from about 1 sec to about 10 sec, and is in a range from about 2 sec to about 8 sec in other embodiments, depending on design and/or process requirements/conditions.

By the pre-deposition cleaning operation, the second etch stop layer 75 is etched. In some embodiments, as shown in FIG. 6, the bottom corners of the second etch stop layer 75 have rounded corners. In some embodiments, a radius of curvature of the rounded corner is in a range from about 0.2 nm to 0.4 nm and is in a range from about 0.25 nm to about 0.35 nm in other embodiments, depending on design and/or process requirements/conditions.

In some embodiments, a ratio of the width D2 of the recess 85 to the narrowest width D1 (diameter) of the second contact hole 82 (D2/D1) is in a range from about 1.2 to about 2.5, and is in a range from about 1.5 to about 2.0 in other embodiments, depending on design and/or process requirements/conditions. In some embodiments, the depth D3 of the recess 85 in a vertical direction is in a range from about 2 nm to about 20 nm, and is in a range from about 5 nm to about 12 nm in other embodiments, depending on design and/or process requirements/conditions.

Figure 7B:
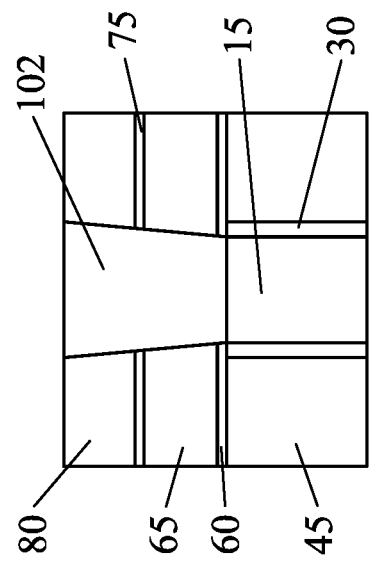
FIGS. 7A and 7B show cross sectional views of various stages of the sequential fabrication process of a semiconductor device according to an embodiment of the present disclosure.
Figure 7A:
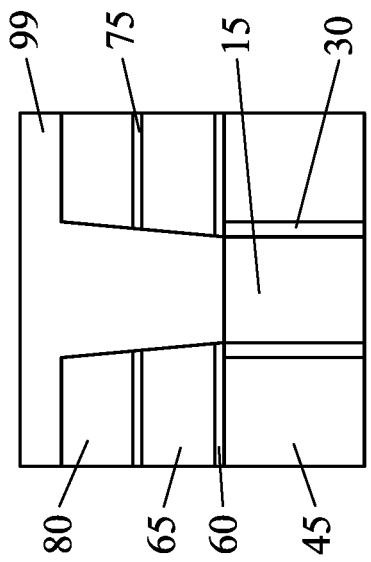

Subsequent to the pre-deposition cleaning operation, a conductive material layer 99 is formed in the second contact hole 82 and the third contact hole 84 and on the third ILD layer 80 as shown in FIGS. 7A and 7B. In some embodiments, the conductive material layer 99 is made of Ru. As shown in FIGS. 7A and 7B, the Ru layer 99 is formed without any conductive barrier or liner layer. In some embodiments, the Ru layer 99 is formed after the pre-deposition cleaning operation without breaking vacuum (without being exposed to atmosphere or any oxidizing atmosphere).

In some embodiments, the Ru layer is formed by a thermal CVD method (no plasma) at a temperature in a range from about 100° C. to about 250° C. at a pressure in a range from about 0.5 mTorr to about 1000 mTorr, depending on design and/or process requirements/conditions. In some embodiments, a source gas for ruthenium includes one or more of triruthenium dodecacarbonyl ($Ru_3(CO)_{12}$), and organic Ru compounds, such as $Ru[C_5H_5(CO)_2]_2$, or cyclopentadienyl-propylcyclopentadienylruthenium(II) (RuCp(i-PrCp)). The Ru CVD process is a selective CVD process growing from a Co surface of the source/drain contact 70 in some embodiments.

Figure 8B:
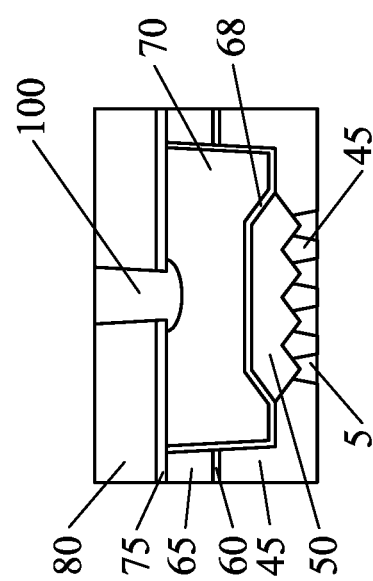
FIGS. 8A and 8B show cross sectional views of various stages of the sequential fabrication process of a semiconductor device according to an embodiment of the present disclosure.
Figure 8A:
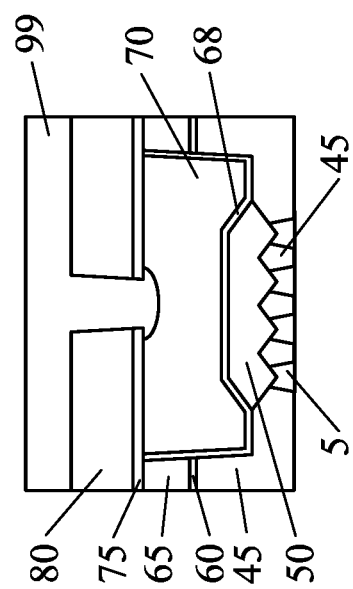
Figure 9B:
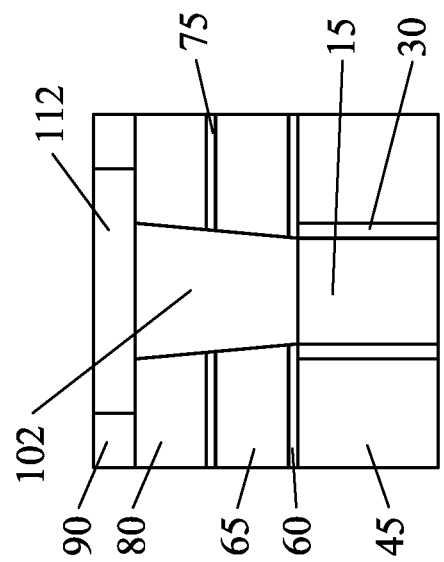
FIGS. 9A and 9B show cross sectional views of various stages of the sequential fabrication process of a semiconductor device according to an embodiment of the present disclosure.
Figure 9A:
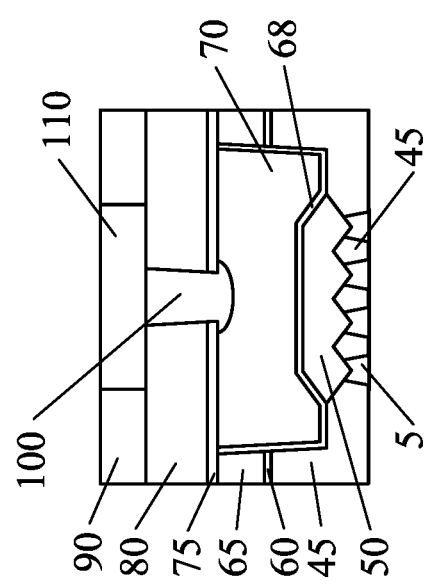

Then, as shown in FIGS. 8A and 8B, a planarization operation, such as an etch-back operation or a CMP operation, is performed to form the upper contact 100 and the gate contact 102. Further, as shown in FIGS. 9A and 9B, additional upper ILD layer 90 is formed over the third ILD layer 80 and via contacts 110 and 112 are formed on the upper contact 100 and the gate contact 102, respectively. In some embodiments, the upper contacts include one or more of TiN, Ti, Ta, TaN, W, Co, Ni, Mo, Cu and Al and alloys thereof. As shown in FIGS. 9A and 9B, the upper contact 100 over the lower contact (source/drain contact) 70 has a rivet shape, while the gate contact 102 has a substantially flat bottom over the gate electrode 10 (no recess in the gate electrode).

In some embodiments, no dopant implantation operation (e.g., a Ge doping) to any of the ILD layers is performed.

It is understood that the device shown in FIGS. 9A and 9B undergoes further CMOS processes to form various features such as interconnect metal layers, dielectric layers, passivation layers, etc.

Figure 10:
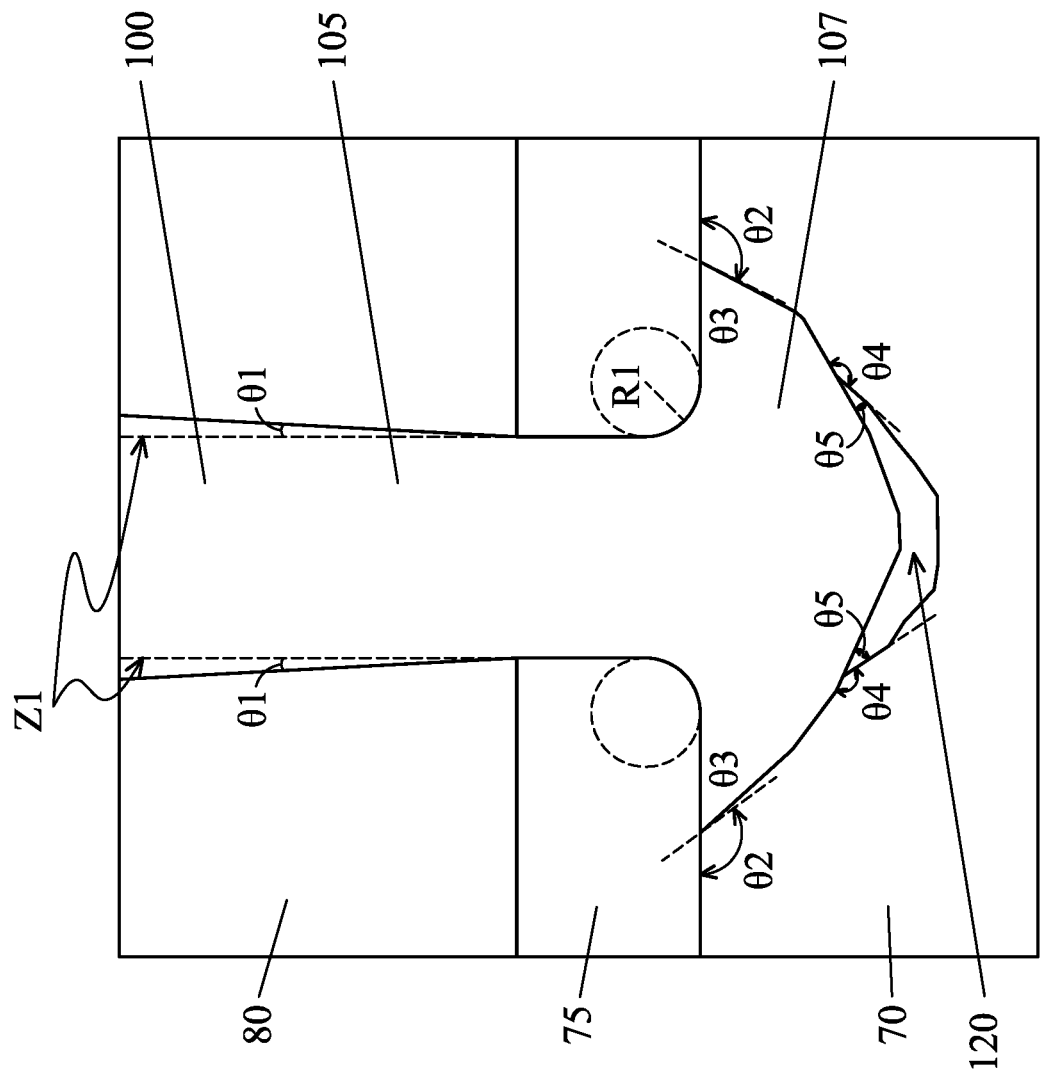
FIG. 10 shows a cross sectional view of a semiconductor device according to an embodiment of the present disclosure.
Figure 11:
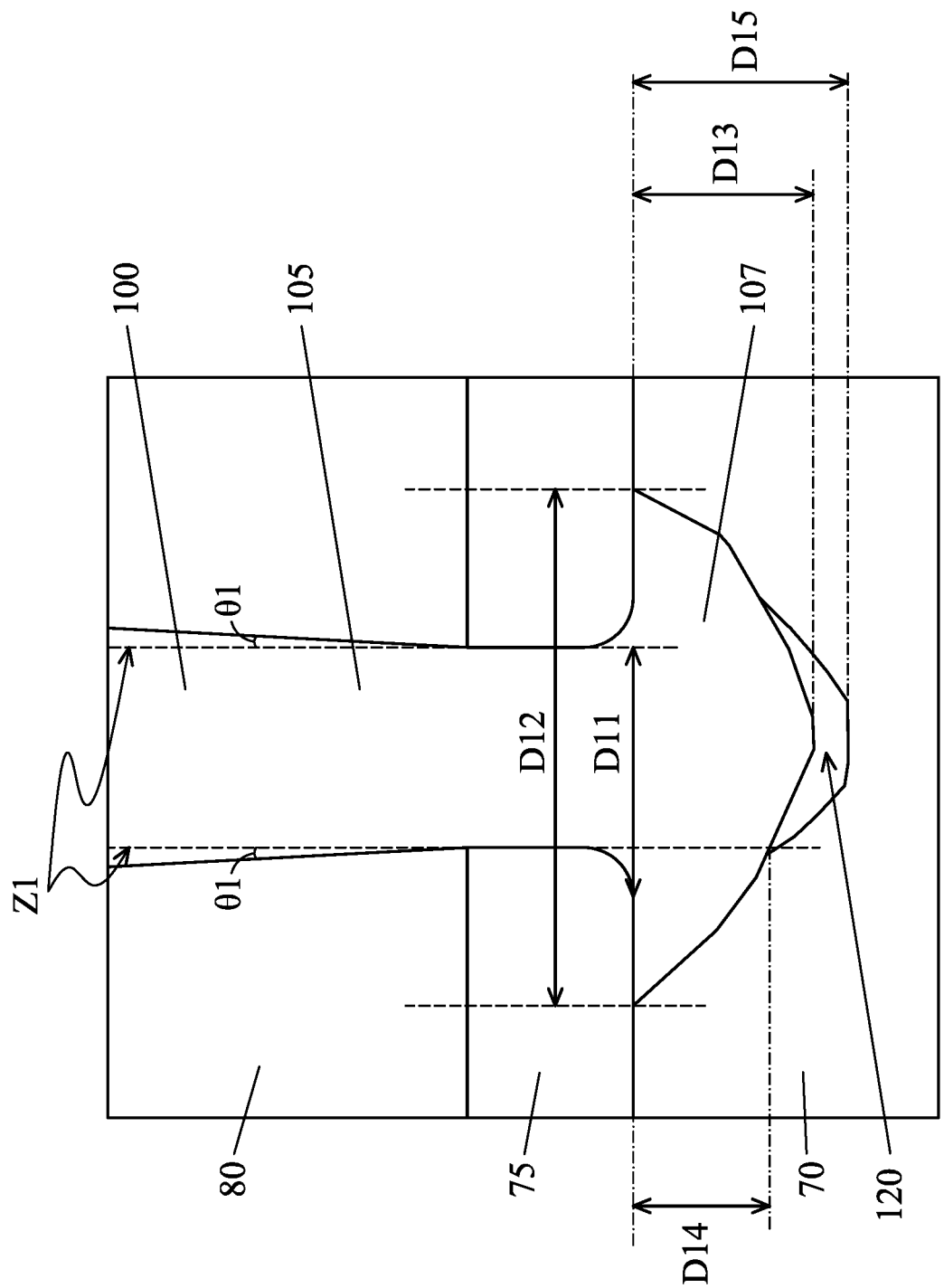
FIG. 11 shows a cross sectional view of a semiconductor device according to an embodiment of the present disclosure.

FIGS. 10 and 11 show a cross sectional view of the upper contact 100 manufactured according to the embodiments as set forth above.

As shown in FIG. 10, the upper contact 100 has a plug portion 105 above the source/drain contact 70 and a rivet portion 107 embedded in the source/drain contact 70. As shown in FIGS. 10 and 11, the interface between the rivet portion 107 of the upper contact 100 and the source/drain contact 70 is clearly observed. This means that there is substantially no intermixing of ruthenium (layer 107) and cobalt (layer 70). In some embodiments, an intermixed region exists, and the width of the intermixed region is more than 0.2 nm and less than 0.5 nm. As set forth above, a pre-deposition cleaning operation is performed before ruthenium is deposited in the recess 85. The pre-deposition cleaning operation removes an oxide formed on the surface of the Co layer of the source/drain contact 70 and removes or terminates surface dangling bonds of the Co layer, which is believed to prevent intermixing of Ru and Co.

In some embodiments, the plug portion 105 has a tapered shape having a taper angle $\theta 1$ with respect to the normal direction of the substrate in a range from about 1.0 degrees to about 4.0 degrees, and in other embodiments, the taper angle is in a range from about 1.4 degrees to about 3.1 degrees. The taper angle $\theta 1$ corresponds to the taper angle of the sidewall of the second contact hole 82. When the taper angle $\theta 1$ is below these ranges, ruthenium layer may not be fully filled in the second contact hole 82, thereby causing a void or a slit. When the taper angle $\theta 1$ exceeds these ranges, the bottom area of the plug portion becomes too small or the top area of the plug portion becomes too large, which would cause undesired high resistance and/or current leakage.

In some embodiments, as shown in FIG. 10, the bottom corners of the second etch stop layer 75 have rounded corners, and the Ru contact 100 is conformally formed along the rounded corners. In some embodiments, a radius of curvature R1 of the rounded corner of the bottom edge of the second etch stop layer 75 is in a range from about 0.25 nm to about 0.35 nm, and is in a range from about 0.28 nm to about 0.32 nm in other embodiments. The rounded corners within these ranges reduces shear stress in the Ru layer.

In some embodiments, the lateral ends of the rivet portion 107 have the following configurations. An angle $\theta 2$ in the source/drain contact 70 between the interface of the rivet portion 107 and the source/drain contact 70 and the bottom surface of the second etch stop layer 75 is in a range from about 110 degrees to about 130 degrees in some embodiments, and is in a range from about 112 degrees to about 128 degrees in other embodiments. The angle $\theta 3$ in the rivet portion 107 between the interface of the rivet portion 107 and the source/drain contact 70 and the bottom surface of the second etch stop layer 75 is $(180°-\theta 2)$.

In some embodiments, an over treatment region 120 is formed in the Co source/drain contact 70 below the rivet portion 107 as shown in FIGS. 10 and 11. The over treatment portion 120 is a part of the Co layer formed by the pre-deposition treatment, and has a disordered structure of Co atoms compared with the body of the source/drain contact 70.

An angle $\theta 4$ in the source/drain contact 70 between the rivet portion 107 and the over treatment portion 120 is in a range from about 130 degrees to about 150 degrees in some embodiments, and is in a range from about 132 degrees to about 146 degrees in other embodiments. The angle $\theta 5$ in the rivet portion 107 between the rivet portion 107 and the over treatment portion 120 is in a range from about 30 degrees to about 40 degrees in some embodiments, and is in a range from about 36 degrees to about 38 degrees in other embodiments.

When the angles $\theta 2$-$\theta 5$ are within these ranges, the shear stress in the Ru layer can be reduced and Co corrosion under the rivet portion 107 can be suppressed.

Referring to FIG. 11, in some embodiments, a width (diameter) D11 at the bottom of the plug portion 105 (at the level of the interface between the second etch stop layer 75 and the source/drain contact 70) is in a range from about 5 nm to about 20 nm, and is in a range from about 8 nm to about 15 nm, depending on the design and/or process requirements/conditions. In some embodiments, the maximum lateral width (diameter) D12 of the rivet portion 107 at the level of the interface between the second etch stop layer 75 and the source/drain contact 70 is in a range from about 10 nm to about 30 nm, and is in a range from about 13 nm to about 23 nm, depending on the design and/or process requirements. In some embodiments, a ratio D12/D11 is in a range from about 1.2 to about 2.5, and is in a range from about 1.5 to about 2.0 in other embodiments, depending on design and/or process requirements/conditions. In some embodiments, the depth D13 of the rivet portion 107 from the interface between the second etch stop layer 75 and the source/drain contact 70 in a vertical direction is in a range from about 2 nm to about 20 nm, and is in a range from about 5 nm to about 12 nm in other embodiments, depending on design and/or process requirements/conditions.

Further, the vertical lines Z1 shown in FIG. 11 correspond to the minimum width of the plug portion 105 and in contact with the sidewall of the second etch stop layer 75. The depth D14 of the rivet portion at the point where the line Z1 crosses the bottom of the rivet portion in the vertical direction is in a range from about 7 nm to about 10 nm, and is in a range from about 8 nm to about 9 nm in other embodiments, depending on design and/or process requirements/conditions. The depth D15 of the over treatment region 120 from the interface between the second etch stop layer 75 and the source/drain contact 70 in the vertical direction is in a range from about 2.5 nm to about 20 nm, and is in a range from about 4 nm to about 16 nm in other embodiments, depending on design and/or process requirements/conditions.

When the dimensions as set forth above are within these ranges, the shear stress in the Ru layer can be reduced and Co corrosion under the rivet portion 107 can be suppressed.

Figure 12B:
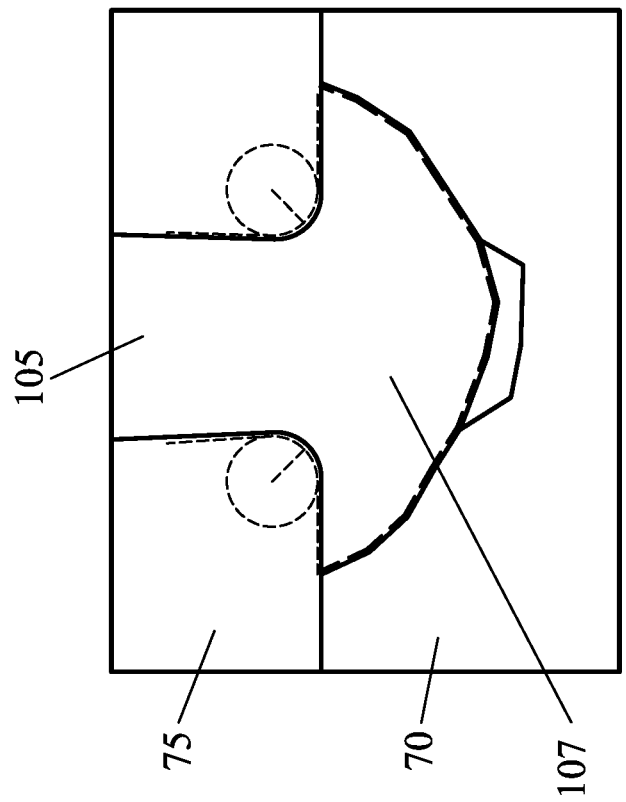
FIGS. 12A and 12B show cross sectional views of a semiconductor device according to embodiments of the present disclosure.
Figure 12A:
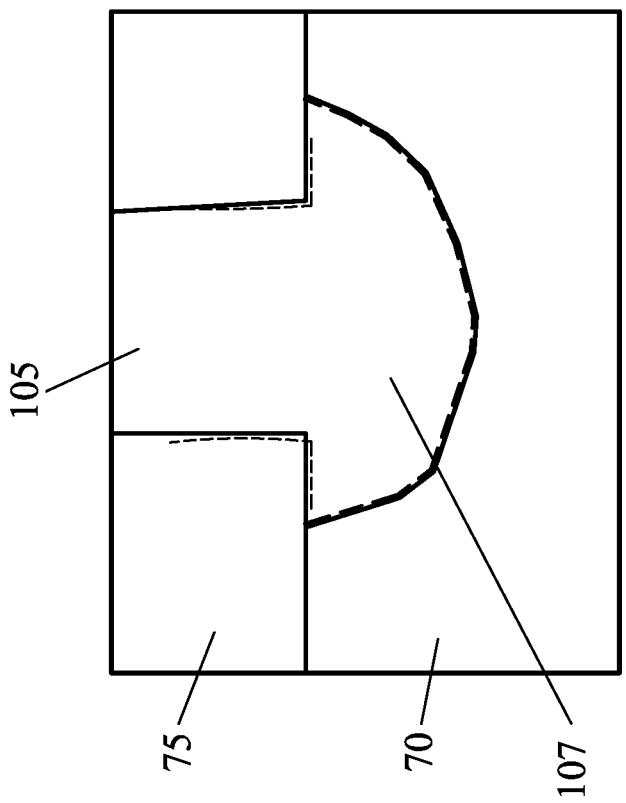
Figure 13:
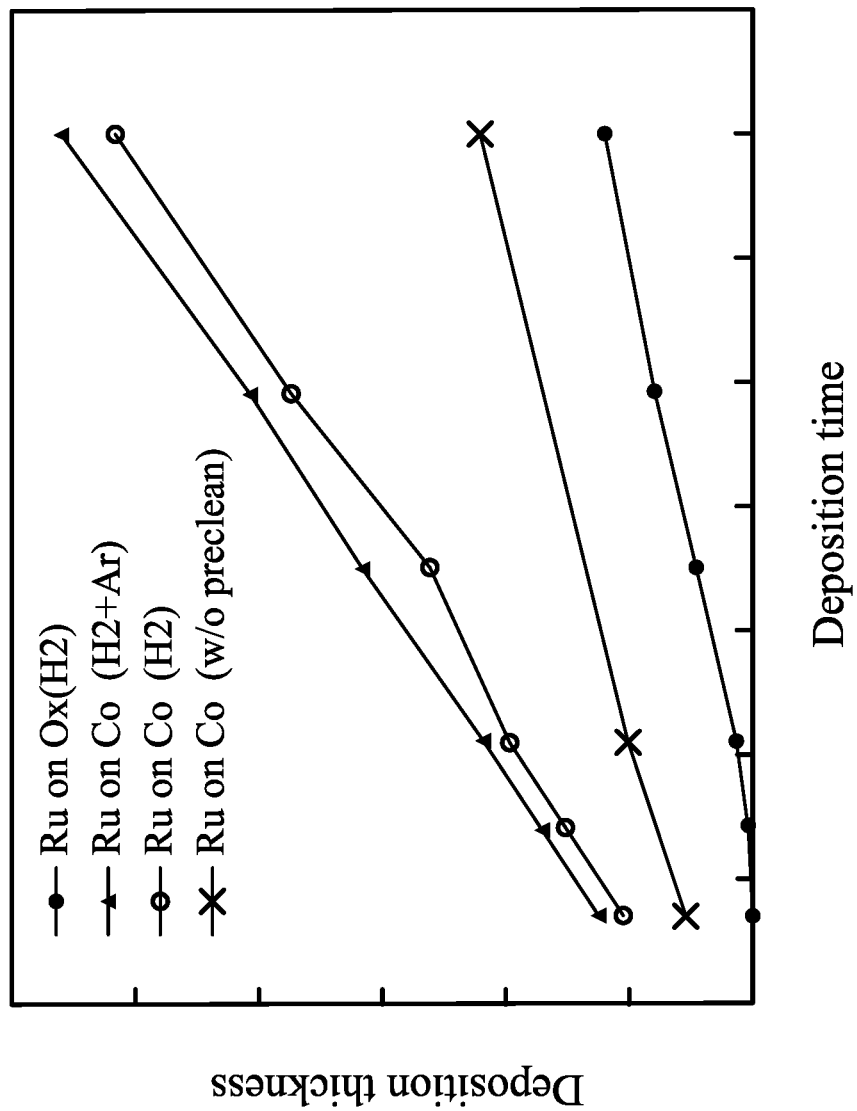
FIG. 13 shows deposition rates of Ru in various conditions.

FIGS. 12A and 12B show cross sectional views showing the effect of the pre-deposition cleaning operation. FIG. 13 shows deposition rates of Ru in various conditions showing the effect of the pre-deposition cleaning operation.

In FIG. 12A, the pre-deposition cleaning operation includes hydrogen plasma treatment without argon plasma treatment, and in FIG. 12B, the pre-deposition cleaning operation includes hydrogen plasma treatment followed by argon plasma treatment. As shown in FIG. 12A, the bottom corners of the second etch stop layer 75 do not have clear rounded corners, and when the bottom corners have clear rounded corners, the radius of curvature is less than about 0.1 nm. In some embodiments, slight intermixing of Ru and Co is observed. As shown in FIG. 12B, when the argon plasma treatment is additionally employed, the bottom corners of the second etch stop layer 75 have clear rounded corners as set forth above. Further, substantially no intermixing of Ru and Co is observed.

FIG. 13 shows deposition rates of Ru in various conditions further showing the effect of the pre-deposition cleaning operation. The line "Ru on Ox (H2)" shows a deposition thickness of Ru on a silicon oxide surface which is subjected to hydrogen pre-deposition cleaning operation, the line "Ru on Co (H2+Ar)" shows a deposition thickness of Ru on a cobalt surface which is subjected to hydrogen and argon pre-deposition cleaning, the line "Ru on Co (H2)" shows a deposition thickness of Ru on a Co surface which is subjected to hydrogen pre-deposition cleaning, and the line "Ru on Co (w/o pre-clean)" shows a deposition thickness of Ru on a Co surface which is not subjected to the pre-deposition cleaning. As shown in FIG. 13, since a deposition rate on the silicon oxide surface is much smaller than a deposition rate on the Co surface, the Ru can be selectively formed on the Co surface (i.e., the source/drain contact 70). Further, the pre-deposition cleaning operation can enhance the deposition rate on the Co surface. In particular, when the pre-deposition cleaning operation includes the hydrogen plasma treatment followed by the argon plasma treatment, the deposition rate is highest, which means that the selectivity between the Co surface and the silicon oxide surface is highest.

In the foregoing embodiments, the Ru contact is formed on the Co source/drain contact without an interposing conductive contact liner or barrier layer between the Ru contact and the interlayer dielectric layers. The Ru contact has various advantages over a W contact. When W is used as an upper contact, breakage of W layer and/or corrosion of the Co layer are common issues, which require tighter process controls to mitigate the issues. In contrast, the Ru contact in combination of the pre-deposition cleaning operation of the present embodiments is substantially free from breakage caused by shear stress and the Co corrosion.

The various embodiments or examples described herein offer several advantages over the existing art. It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a source/drain structure is formed over a substrate, a first interlayer dielectric (ILD) layer including one or more first insulating layers is formed over the source/drain structure, a first opening is formed in the first ILD layer to at least partially expose the source/drain structure, the first opening is filled with a first conductive material to form a source/drain contact in contact with the source/drain structure, a second ILD layer including a first layer and a second layer disposed on the first layer is formed over the source/drain contact and the first ILD layer, a second opening is formed in the second ILD layer to at least partially expose the source/drain contact, and the second opening is filled with a second conductive material to form an upper contact in direct contact with the source/drain contact and in direct contact with the second ILD layer without an interposing conductive barrier layer. In one or more of the foregoing and the following embodiments, the second conductive material includes ruthenium. In one or more of the foregoing and the following embodiments, the upper contact includes an impurity other than ruthenium. In one or more of the foregoing and the following embodiments, an amount of impurity is in a range from 0.00001 atomic % to 0.1 atomic %. In one or more of the foregoing and the following embodiments, the impurity is one or more selected from the group consisting of alkaline metals and alkaline earth metals. In one or more of the foregoing and the following embodiments, the impurity is carbon. In one or more of the foregoing and the following embodiments, the first conductive material is Co. In one or more of the foregoing and the following embodiments, the first layer is made of a silicon nitride based material and the second layer is made of a silicon oxide based material.

In accordance with another aspect of the present disclosure, in a method of manufacturing a semiconductor device, a source/drain structure is formed over a substrate, a first interlayer dielectric (ILD) layer including one or more first insulating layers is formed over the source/drain structure, a first opening is formed in the first ILD layer to at least partially expose the source/drain structure, the first opening is filled with a first conductive material to form a source/drain contact in contact with the source/drain structure, a second ILD layer including a first layer and a second layer disposed on the first layer is formed over the source/drain contact and the first ILD layer, a second opening is formed in the second ILD layer to at least partially expose the source/drain, the source/drain contact is partially etched to form a recess, the recess extending below the first layer, and the second opening and the recess are filled by ruthenium to form an upper contact in direct contact with the source/drain contact and in direct contact with the second ILD layer without an interposing conductive barrier layer. In one or more of the foregoing and the following embodiments, the recessing includes a wet etching. In one or more of the foregoing and the following embodiments, an etchant of the wet etching comprises an organic acid. In one or more of the foregoing and the following embodiments, after the recessing, a plasma treatment is performed on the recess and the first layer. In one or more of the foregoing and the following embodiments, the plasma treatment comprises a first plasma treatment using hydrogen plasma and a second plasma treatment using argon plasma following the first plasma treatment. In one or more of the foregoing and the following embodiments, after the plasma treatment, a bottom corner of the first layer constituting the second opening has a rounded corner. In one or more of the foregoing and the following embodiments, the first layer is made of a silicon nitride based material and the second layer is made of a silicon oxide based material. In one or more of the foregoing and the following embodiments, a purity of ruthenium in the upper contact is equal to or more than 99.9% and less than 100%. In one or more of the foregoing and the following embodiments, the ruthenium of the upper contact is formed by thermal CVD at a temperature in a range from 100° C. to 250° C.

In accordance with another aspect of the present disclosure, in a method of manufacturing a semiconductor device, a source/drain structure is formed over a substrate, a gate electrode is formed adjacent to the source/drain structure, a first interlayer dielectric (ILD) layer including one or more first insulating layers is formed over the first source/drain structure and the gate electrode, a first opening is formed in the first ILD layer to at least partially expose the source/drain structure, the first opening is filled with a first conductive material to form a first lower contact in contact with the first source/drain structure, a second ILD layer including a first layer and a second layer disposed on the first layer is formed over the first lower contact and the first ILD layer, a second opening is formed to at least partially expose the first lower contact and a third opening to at least partially expose the gate electrode, and the second opening and the third opening are filled with a second conductive material to form a first upper contact in direct contact with the first lower contact and in direct contact with the second ILD layer and a second upper contact in direct contact with the gate electrode and in direct contact with the second ILD layer and at least one insulating layer of the first ILD layer. In one or more of the foregoing and the following embodiments, the second conductive material includes ruthenium. In one or more of the foregoing and the following embodiments, in the forming the second opening and the third opening, the second ILD layer is etched to at least partially expose the first lower contact and the second ILD layer and a part of the first ILD layer above the gate electrode, wherein one of the first ILD layer remains on the gate electrode, a part of the first lower contact is etched to form a recess and etching the one of the first ILD layer remaining on the gate electrode to at least partially expose the gate electrode, and a plasma treatment is performed on the recess and the first layer.

In accordance with one aspect of the present disclosure, a semiconductor device includes a gate electrode, a source/drain structure, a lower contact contacting either of the gate electrode or the source/drain structure, and an upper contact disposed in an opening formed in an interlayer dielectric (ILD) layer and being in direct contact with the lower contact. The upper contact is in direct contact with the ILD layer without an interposing conductive barrier layer, and the upper contact includes ruthenium. In one or more of the foregoing and the following embodiments, the upper contact includes an impurity other than ruthenium. In one or more of the foregoing and the following embodiments, an amount of impurity is in a range from 0.00001 atomic % to 0.1 atomic %. In one or more of the foregoing and the following embodiments, the impurity is one or more selected from the group consisting of alkaline metals and alkaline earth metals. In one or more of the foregoing and the following embodiments, the impurity is carbon. In one or more of the foregoing and the following embodiments, the lower contact contacts the source/drain structure, is disposed in an opening formed in one or more insulating material layers, and includes Co. In one or more of the foregoing and the following embodiments, the lower contact includes a conductive liner layer disposed between a Co layer and the one or more insulating material layer. In one or more of the foregoing and the following embodiments, the conductive liner layers is made of one or more of Ti, TiN, Ta and TaN.

In accordance with another aspect of the present disclosure, a semiconductor device includes a gate electrode, a source/drain structure, a lower contact contacting the source/drain structure and disposed in a first opening formed in a first dielectric layer including one or more insulating materials, and an upper contact disposed in a second opening formed in a second dielectric layer and being in direct contact with the lower contact. The upper contact is in direct contact with the ILD layer without an interposing conductive barrier layer, and includes ruthenium, the second dielectric layer includes a first layer and a second layer disposed on the first layer, and a part of the upper contact penetrates into the lower contact, is disposed below the first layer of the second dielectric layer and is in contact with a bottom surface of the first layer. In one or more of the foregoing and the following embodiments, the first layer is made of silicon nitride or silicon oxynitride. In one or more of the foregoing and the following embodiments, the upper contact has a rivet shape. In one or more of the foregoing and the following embodiments, a bottom corner of the first layer constituting the second opening has a rounded corner. In one or more of the foregoing and the following embodiments, a radius of curvature of the rounded corner is in a range from 0.25 nm to 0.35 nm. In one or more of the foregoing and the following embodiments, a penetration amount of the upper contact into the lower contact in a vertical direction is in a range from 2 nm to 20 nm. In one or more of the foregoing and the following embodiments, the second opening has a tapered shape having a smaller size at a bottom then a top. In one or more of the foregoing and the following embodiments, a taper angle of the tapered shape is in a range from 1.4 degrees to 3.1 degrees.

In accordance with another aspect of the present disclosure, a semiconductor device includes a gate electrode, a source/drain structure, a source/drain contact contacting the source/drain structure and disposed in a first opening formed in a first insulating layer and a second insulating layer disposed over the first insulating layer, a gate contact contacting the gate electrode and disposed in a second opening formed in the second insulating layer and a third insulating layer disposed over the second insulating layer, and an upper contact disposed in a third opening formed in the third insulating layer and being in direct contact with the source/drain contact. The upper contact is in direct contact with the third insulating layer without an interposing conductive barrier layer, and includes ruthenium, a fourth insulating layer is disposed between the second insulating layer and the third insulating layer, and a part of the upper contact penetrates into the source/drain contact, is disposed below the fourth insulating layer and is in contact with a bottom surface of the fourth insulating layer. In one or more of the foregoing and the following embodiments, the gate contact is in direct contact with the third insulating layer, the fourth insulating layer and the second insulating layer without an interposing conductive barrier layer, and includes ruthenium. In one or more of the foregoing and the following embodiments, the gate electrode extends in a first direction, the source drain structure includes a source/drain epitaxial layer, and a width of the source/drain epitaxial layer is smaller than a width of the source/drain contact in the first direction. In one or more of the foregoing and the following embodiments, a purity of ruthenium in the upper contact and the gate contact is equal to or more than 99.9% and less than 100%. In one or more of the foregoing and the following embodiments, the upper contact has a rivet shape and the gate contact has no rivet shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a source/drain structure over a substrate;
    forming a first interlayer dielectric (ILD) layer including one or more first insulating layers over the source/drain structure;
    forming a first opening in the first ILD layer to at least partially expose the source/drain structure;
    filling the first opening with a first conductive material to form a source/drain contact in contact with the source/drain structure;
    forming a second ILD layer including a first layer and a second layer disposed on the first layer over the source/drain contact and the first ILD layer;
    forming a second opening in the second ILD layer to partially etch the source/drain contact; and
    filling the second opening with a second conductive material to form an upper contact in direct contact with the source/drain contact and in direct contact with the second ILD layer without an interposing conductive barrier layer,
    wherein the second conductive material includes ruthenium.

2. The method of claim 1, wherein the upper contact includes an impurity other than ruthenium.

3. The method of claim 2, wherein an amount of impurity is in a range from 0.00001 atomic % to 0.1 atomic %.

4. The method of claim 2, wherein the impurity is one or more selected from the group consisting of alkaline metals and alkaline earth metals.

5. The method of claim 2, wherein the impurity is carbon.

6. The method of claim 1, wherein the first conductive material is Co.

7. The method of claim 6, wherein a part of the source/drain contact under the upper contact has a disordered structure of Co atoms.

8. The method of claim 1, wherein the first layer is made of a silicon nitride based material and the second layer is made of a silicon oxide based material.

9. A method of manufacturing a semiconductor device, the method comprising:
    forming a source/drain structure over a substrate;
    forming a first interlayer dielectric (ILD) layer including one or more first insulating layers over the source/drain structure;
    forming a first opening in the first ILD layer to at least partially expose the source/drain structure;
    filling the first opening with a first conductive material to form a source/drain contact in contact with the source/drain structure;
    forming a second ILD layer including a first layer and a second layer disposed on the first layer over the source/drain contact and the first ILD layer;
    forming a second opening in the second ILD layer to at least partially expose the source/drain;
    partially recessing the source/drain contact to form a recess, the recess extending below the first layer;
    performing a cleaning operation on the recess and the first layer; and
    filling the second opening and the recess with ruthenium to form an upper contact in direct contact with the source/drain contact and in direct contact with the second ILD layer without an interposing conductive barrier layer.

10. The method of claim 9, wherein the partially recessing includes a wet etching.

11. The method of claim 10, wherein an etchant of the wet etching comprises an organic acid.

12. The method of claim 9, wherein the cleaning operation comprises performing a plasma treatment on the recess and the first layer.

13. The method of claim 12, wherein the plasma treatment comprises a first plasma treatment using hydrogen plasma and a second plasma treatment using argon plasma following the first plasma treatment.

14. The method of claim 12, wherein after the plasma treatment, a bottom corner of the first layer constituting the second opening has a rounded corner.

15. The method of claim 9, wherein the first layer is made of a silicon nitride based material and the second layer is made of a silicon oxide based material.

16. The method of claim 9, wherein a purity of the ruthenium of the upper contact is equal to or more than 99.9% and less than 100%.

17. The method of claim 9, wherein the ruthenium of the upper contact is formed by thermal CVD at a temperature in a range from 100° C. to 250° C.

18. A method of manufacturing a semiconductor device, the method comprising:
    forming a source/drain structure over a substrate;
    forming a gate electrode adjacent to the source/drain structure;
    forming a first interlayer dielectric (ILD) layer including one or more first insulating layers over the first source/drain structure and the gate electrode;
    forming a first opening in the first ILD layer to at least partially expose the source/drain structure;
    filling the first opening with a first conductive material to form a first lower contact in contact with the first source/drain structure;
    forming a second ILD layer including a first layer and a second layer disposed on the first layer over the first lower contact and the first ILD layer;
    forming a second opening to partially etch the first lower contact and a third opening to at least partially expose the gate electrode; and
    filling the second opening and the third opening with a second conductive material to form a first upper contact in direct contact with the first lower contact and in direct contact with the second ILD layer and a second upper contact in direct contact with the gate electrode and in direct contact with the second ILD layer and at least a part of the first ILD layer.

19. The method of claim 18, wherein the second conductive material includes ruthenium.

20. The method of claim 18, wherein the forming the second opening and the third opening comprises:

etching the second ILD layer to at least partially expose the first lower contact and the second ILD layer and a part of the first ILD layer above the gate electrode, wherein a portion of the first ILD layer remains on the gate electrode;
etching a part of the first lower contact to form a recess and etching the portion of the first ILD layer remaining on the gate electrode to at least partially expose the gate electrode; and
performing a plasma treatment on the recess and the first layer.

* * * * *